(12) United States Patent
Kim

(10) Patent No.: US 10,665,318 B2
(45) Date of Patent: May 26, 2020

(54) SEMICONDUCTOR SYSTEMS

(71) Applicant: SK hynix Inc., Icheon-si, Gyeonggi-do (KR)

(72) Inventor: Woongrae Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 42 days.

(21) Appl. No.: 16/045,536

(22) Filed: Jul. 25, 2018

(65) Prior Publication Data

US 2019/0180839 A1 Jun. 13, 2019

(30) Foreign Application Priority Data

Dec. 12, 2017 (KR) .................. 10-2017-0170087

(51) Int. Cl.

| | |
|---|---|
| G11C 29/00 | (2006.01) |
| G11C 29/42 | (2006.01) |
| G06F 1/06 | (2006.01) |
| H03M 13/29 | (2006.01) |
| G11C 29/52 | (2006.01) |
| G06F 11/10 | (2006.01) |
| G11C 29/02 | (2006.01) |
| G11C 7/10 | (2006.01) |
| G11C 29/04 | (2006.01) |
| G11C 5/04 | (2006.01) |

(52) U.S. Cl.
CPC .............. *G11C 29/42* (2013.01); *G06F 1/06* (2013.01); *G06F 11/1068* (2013.01); *G11C 7/1015* (2013.01); *G11C 29/023* (2013.01); *G11C 29/028* (2013.01); *G11C 29/52* (2013.01); *H03M 13/2906* (2013.01); *G11C 5/04* (2013.01); *G11C 2029/0411* (2013.01)

(58) Field of Classification Search
CPC ....... G11C 29/42; G11C 29/52; G11C 29/028; G11C 29/023; G06F 1/06; G06F 11/1068; H03M 13/2906
See application file for complete search history.

(56) References Cited

U.S. PATENT DOCUMENTS

| | | | |
|---|---|---|---|
| 8,046,559 B2 | 10/2011 | Zheng et al. | |
| 2015/0363255 A1* | 12/2015 | Dell ...................... | G06F 3/0619 |
| | | | 714/6.2 |
| 2017/0017587 A1* | 1/2017 | West ................... | G06F 13/4068 |

FOREIGN PATENT DOCUMENTS

KR 101366960 B1 2/2014

* cited by examiner

*Primary Examiner* — Samir W Rizk
(74) *Attorney, Agent, or Firm* — William Park & Associates Ltd.

(57) ABSTRACT

A semiconductor system may include a first and second rank, and a semiconductor device. The semiconductor device may be configured to receive information on the first and second ranks to prioritize which rank out of the first and second ranks to perform an operation with instead of the other rank. The information may include PVT conditions. The information may include error occurrences of the first or second ranks.

40 Claims, 11 Drawing Sheets

SEMICONDUCTOR SYSTEMS

CROSS-REFERENCE TO RELATED APPLICATIONS

The present application claims priority under 35 U.S.C 119(a) to Korean Application No. 10-2017-0170087, filed on Dec. 12, 2017, which is incorporated herein by reference in its entirety.

BACKGROUND

1. Technical Field

Embodiments of the present disclosure generally relate to semiconductor systems, and more particularly, to semiconductor systems relating to prioritizing operations for a plurality of ranks.

2. Related Art

Recently, a DDR2 scheme or a DDR3 scheme has been used to improve an operation speed of the semiconductor devices. The DDR2 scheme or the DDR3 scheme may be designed to receive or output plural-bit data, for example, four-bit data or eight-bit data during each clock cycle time. If a data transmission speed of the semiconductor devices becomes faster, probability of error occurrence may increase while data is transmitted in the semiconductor devices. Accordingly, advanced design schemes may be required to guarantee the reliable transmission of the data.

Whenever data is transmitted in semiconductor devices, error codes which are capable of detecting the occurrence of errors may be generated and transmitted with the data to improve the reliability of data transmission. The error codes may include an error detection code (EDC) which is capable of detecting errors and an error correction code (ECC) which is capable of correcting the errors by itself.

MOS transistors employed in the semiconductor devices may exhibit different characteristics, for example, different current characteristics according to variances of a thickness of a gate insulation layer, a ratio of a channel width to a channel length, a sheet resistance value of a source and a drain, and a threshold voltage thereof. The current characteristics of the MOS transistors may be typically influenced by variation of process/voltage/temperature (PVT) conditions, and the variation of the PVT conditions may affect an aging phenomenon of the MOS transistors.

SUMMARY

According to an embodiment, a semiconductor system may be provided. The semiconductor system may include a first semiconductor device and a second semiconductor device. The first semiconductor device may include a first rank configured for generating a first rank code and a first error code and a second rank configured for generating a second rank code and a second error code. The second semiconductor device may be configured to prioritize operations of the first and second ranks according to the first and second rank codes as well as the first and second error codes. The first rank code may be generated according to a delay time of first test data, and the first error code is generated to include first error occurrence information. The second rank code may be generated according to a delay time of second test data, and the second error code is generated to include second error occurrence information.

According to an embodiment, a semiconductor system may be provided. The semiconductor system may include a first rank, a second rank and a semiconductor device. The first rank may be configured to output a first rank code and a first error code. The second rank may be configured to output a second rank code and a second error code. The semiconductor device may be configured to sense information on process/voltage/temperature (PVT) conditions and error occurrence of the first rank according to the first rank code and the first error code. The semiconductor device may also be configured to sense information on process/voltage/temperature (PVT) conditions and error occurrence of the second rank according to the second rank code and the second error code. The semiconductor device may be configured to arrange a priority order of operations of the first and second ranks according to the sense results.

According to an embodiment, a semiconductor system may be provided. The semiconductor system may include a first and second rank, and a semiconductor device. The semiconductor device may be configured to receive information on the first and second ranks to prioritize which rank out of the first and second ranks to perform an operation with instead of the other rank. The information may include PVT conditions. The information may include error occurrences of the first or second ranks.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor systems arranging a priority order of operations of plural ranks.

Figure 1:
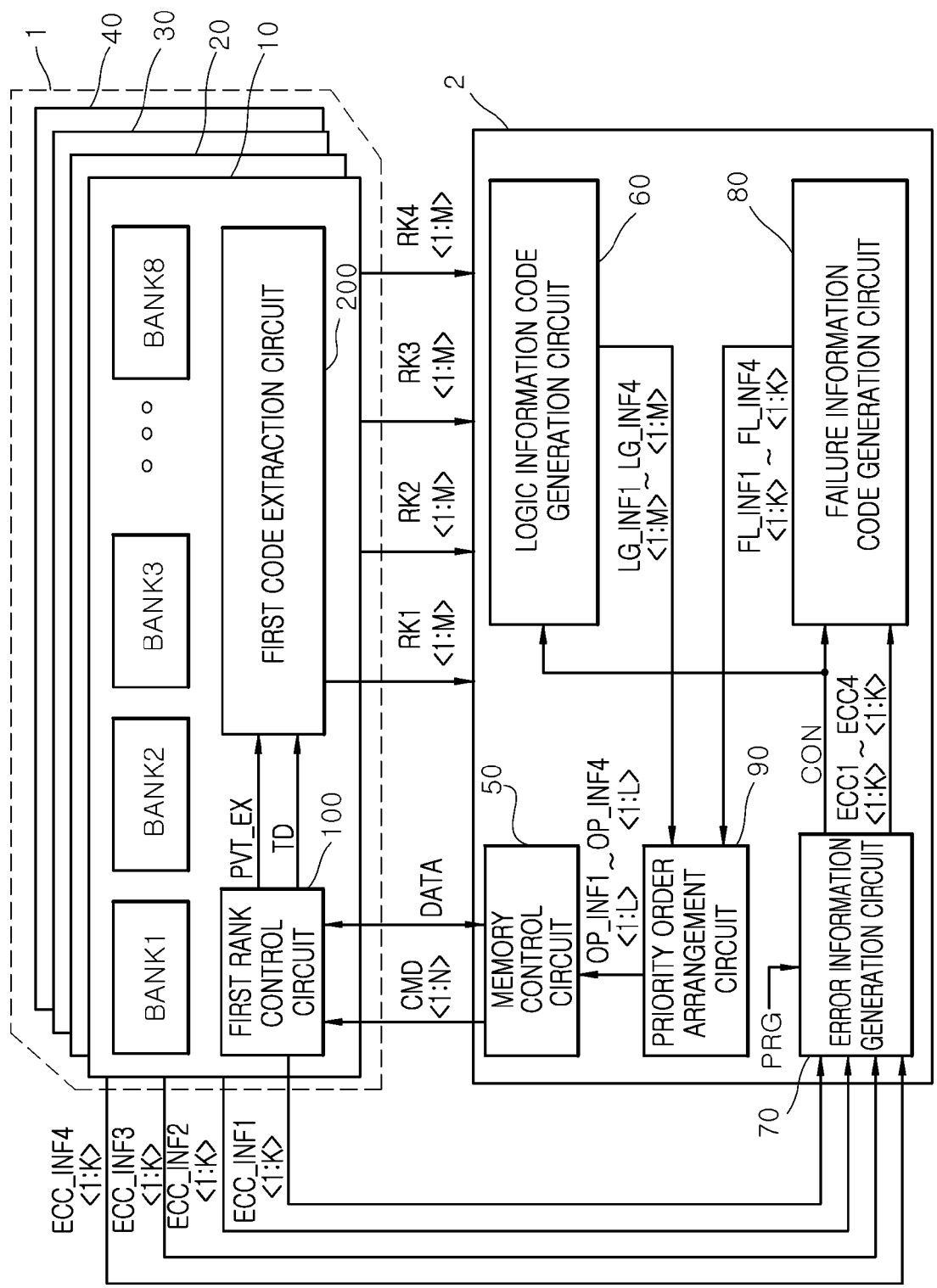
FIG. 1 is a block diagram illustrating a configuration of a semiconductor system according to an embodiment of the present disclosure.

Referring to FIG. 1, a semiconductor system according to an embodiment may include a first semiconductor device 1 and a second semiconductor device 2.

The first semiconductor device 1 may include a first rank 10, a second rank 20, a third rank 30 and a fourth rank 40.

The first rank 10 may include a first rank control circuit 100, a first code extraction circuit 200, and first to eighth banks BANK1~BANK8.

The first rank control circuit 100 may generate a first extraction control signal PVT_EX which is enabled in response to a command CMD<1:N> in a test mode. The first rank control circuit 100 may generate first test data TD from data DATA in response to the command CMD<1:N> in the test mode. The first rank control circuit 100 may generate a first error code ECC_INF1<1:K> including error occurrence information in the test mode. The first rank control circuit 100 may receive or output the data DATA in response to the command CMD<1:N> in a normal mode. The number 'N' of bits included in the command CMD<1:N> may be set to be different according to the embodiments. In addition, the numbers 'K', 'L' and 'M' of bits included in various codes mentioned in the following descriptions may also be set to be different according to the embodiments.

The first code extraction circuit 200 may delay the first test data TD in response to the first extraction control signal PVT_EX. The first code extraction circuit 200 may generate a first rank code RK1<1:M> according to a delay time of the first test data TD. The first rank code RK1<1:M> may be set to include information on variance of PVT conditions of the first rank 10.

The first to eighth banks BANK1~BANK8 may store the data DATA or may output the data DATA stored therein, in the normal mode. The first to eighth banks BANK1~BANK8 may store the data DATA therein during a write operation of the normal mode. The first to eighth banks BANK1~BANK8 may output the data DATA stored therein during a read operation of the normal mode. Although FIG. 1 illustrates the first semiconductor device 1 including the first to eighth banks BANK1~BANK8, the number of the banks included in the first semiconductor device 1 may be different according to the embodiments. Each of the first to eighth banks BANK1~BANK8 may be realized using a general memory circuit.

Each of the second to fourth ranks 20, 30 and 40 may be realized to have substantially the same configuration as the first rank 10 and to perform substantially the same operation as the first rank 10. Thus, a description of the second to fourth ranks 20, 30 and 40 will be omitted hereinafter.

As described above, the first semiconductor device 1 may generate the first rank code RK1<1:M> according to the delay time of the first test data TD and may generate the first error code ECC_INF1<1:K> including the error occurrence information, in the test mode. In addition, the first semiconductor device 1 may generate, with the second rank 20, a second rank code RK2<1:M> according to a delay time of second test data (not illustrated) and may generate a second error code ECC_INF2<1:K> including the error occurrence information, in the test mode. Moreover, the first semiconductor device 1 may generate, with the third rank 30, a third rank code RK3<1:M> according to a delay time of third test data (not illustrated) and may generate a third error code ECC_INF3<1:K> including the error occurrence information, in the test mode. Furthermore, the first semiconductor device 1 may generate, with the fourth rank 40, a fourth rank code RK4<1:M> according to a delay time of fourth test data (not illustrated) and may generate a fourth error code ECC_INF4<1:K> including the error occurrence information, in the test mode.

Although FIG. 1 illustrates the first semiconductor device 1 including four ranks, the number of the ranks included in the first semiconductor device 1 may be different according to the embodiments. In addition, the first semiconductor device 1 may be realized using a general memory circuit.

The second semiconductor device 2 may include a memory control circuit 50, a logic information code generation circuit 60, an error information generation circuit 70, a failure information code generation circuit 80 and a priority order arrangement circuit 90.

The memory control circuit 50 may output the command CMD<1:N> for activating the test mode or the normal mode to the first semiconductor device 1. The memory control circuit 50 may output the data DATA having a certain logic level to the first semiconductor device 1 in the test mode. In the test mode, the memory control circuit 50 may arrange an operation priority order of the first to fourth ranks 10, 20, 30 and 40 according to a first operation information code OP_INF1<1:L>, a second operation information code OP_INF2<1:L>, a third operation information code OP_INF3<1:L> and a fourth operation information code OP_INF4<1:L>. In the test mode, the memory control circuit 50 may prioritize the order of the operations of the first to fourth ranks 10, 20, 30 and 40 according to a first operation information code OP_INF1<1:L>, a second operation information code OP_INF2<1:L>, a third operation information code OP_INF3<1:L> and a fourth operation information code OP_INF4<1:L>. The memory control circuit 50 may output the data DATA to the first semiconductor device 1 during the write operation of the normal mode. The memory control circuit 50 may receive the data DATA from the first semiconductor device 1 during the read operation of the normal mode. The operation priority order of the first to fourth ranks 10, 20, 30 and 40 may be determined by specific bits included in the command CMD<1:N>. The priority order of the operations for the first to fourth ranks 10, 20, 30 and 40 may be determined by specific bits included in the command CMD<1:N>.

The logic information code generation circuit 60 may synthesize the first rank code RK1<1:M> and aging information on the first rank code RK1<1:M> to generate a first logic information code LG_INF1<1:M>, in response to a control signal CON. The logic information code generation circuit 60 may synthesize the second rank code RK2<1:M> and aging information on the second rank code RK2<1:M> to generate a second logic information code LG_INF2<1:M>, in response to the control signal CON. The logic information code generation circuit 60 may synthesize the third rank code RK3<1:M> and aging information on the third rank code RK3<1:M> to generate a third logic information code LG_INF3<1:M>, in response to the control signal CON. The logic information code generation circuit 60 may synthesize the fourth rank code RK4<1:M> and aging information on the fourth rank code RK4<1:M> to generate a fourth logic information code LG_INF4<1:M>, in response to the control signal CON.

The error information generation circuit 70 may generate the control signal CON which is enabled if a program signal PRG is inputted to the error information generation circuit 70 by a predetermined number of times. The error information generation circuit 70 may generate a first error correction code ECC1<1:K> from the first error code ECC_INF1<1:K> in response to the control signal CON. The error information generation circuit 70 may generate a second error correction code ECC2<1:K> from the second error code ECC_INF2<1:K> in response to the control signal CON. The error information generation circuit 70 may generate a third error correction code ECC3<1:K> from the third error code ECC_INF3<1:K> in response to the control signal CON. The error information generation circuit 70 may generate a fourth error correction code ECC4<1:K> from the fourth error code ECC_INF4<1:K> in response to the control signal CON. The program signal PRG may include information on execution of a specific operation. For example, the program signal PRG may be set to be a signal including a pulse that is created whenever the write operation of the normal mode is performed.

The failure information code generation circuit 80 may synthesize the first error correction code ECC1<1:K> and aging information on the first error correction code ECC1<1:K> to generate a first failure information code FL_INF1<1:K>, in response to the control signal CON. The failure information code generation circuit 80 may synthesize the second error correction code ECC2<1:K> and aging information on the second error correction code ECC2<1:K> to generate a second failure information code FL_INF2<1:K>, in response to the control signal CON. The failure information code generation circuit 80 may synthesize the third error correction code ECC3<1:K> and aging information on the third error correction code ECC3<1:K> to generate a third failure information code FL_INF3<1:K>, in response to the control signal CON. The failure information code generation circuit 80 may synthesize the fourth error correction code ECC4<1:K> and aging information on the fourth error correction code ECC4<1:K> to generate a fourth failure information code FL_INF4<1:K>, in response to the control signal CON.

The priority order arrangement circuit 90 may synthesize the first logic information code LG_INF1<1:M> and the first failure information code FL_INF1<1:K> to generate the first operation information code OP_INF1<1:L>. The priority order arrangement circuit 90 may synthesize the second logic information code LG_INF2<1:M> and the second failure information code FL_INF2<1:K> to generate the second operation information code OP_INF2<1:L>. The priority order arrangement circuit 90 may synthesize the third logic information code LG_INF3<1:M> and the third failure information code FL_INF3<1:K> to generate the third operation information code OP_INF3<1:L>. The priority order arrangement circuit 90 may synthesize the fourth logic information code LG_INF4<1:M> and the fourth failure information code FL_INF4<1:K> to generate the fourth operation information code OP_INF4<1:L>.

The second semiconductor device 2 may be realized using a controller or a test circuit for controlling an operation of the first semiconductor device 1.

As described above, the second semiconductor device 2 may generate the first logic information code LG_INF1<1:M>, the second logic information code LG_INF2<1:M>, the third logic information code LG_INF3<1:M> and the fourth logic information code LG_INF4<1:M> from the first rank code RK1<1:M>, the second rank code RK2<1:M>, the third rank code RK3<1:M> and the fourth rank code RK4<1:M>. The second semiconductor device 2 may generate the first failure information code FL_INF1<1:K>, the second failure information code FL_INF2<1:K>, the third failure information code FL_INF3<1:K> and the fourth failure information code FL_INF4<1:K> from the first error code ECC_INF1<1:K>, the second error code ECC_INF2<1:K>, the third error code ECC_INF3<1:K> and the fourth error code ECC_INF4<1:K>. The second semiconductor device 2 may arrange a priority order of operations of the first to fourth ranks 10, 20, 30 and 40 according to the first to fourth logic information codes LG_INF1<1:M>, LG_INF2<1:M>, LG_INF3<1:M> and LG_INF4<1:M> as well as the first to fourth failure information codes FL_INF1<1:K>, FL_INF2<1:K>, FL_INF3<1:K> and FL_INF4<1:K>. The second semiconductor device 2 may arrange a priority order of operations of the first to fourth ranks 10, 20, 30 and 40 according to a logic level combination of the first to fourth rank codes RK1<1:M>, RK2<1:M>, RK3<1:M> and RK4<1:M> as well as the first to fourth error codes ECC_INF1<1:K>, ECC_INF2<1:K>, ECC_INF3<1:K> and ECC_INF4<1:K>.

Figure 2:
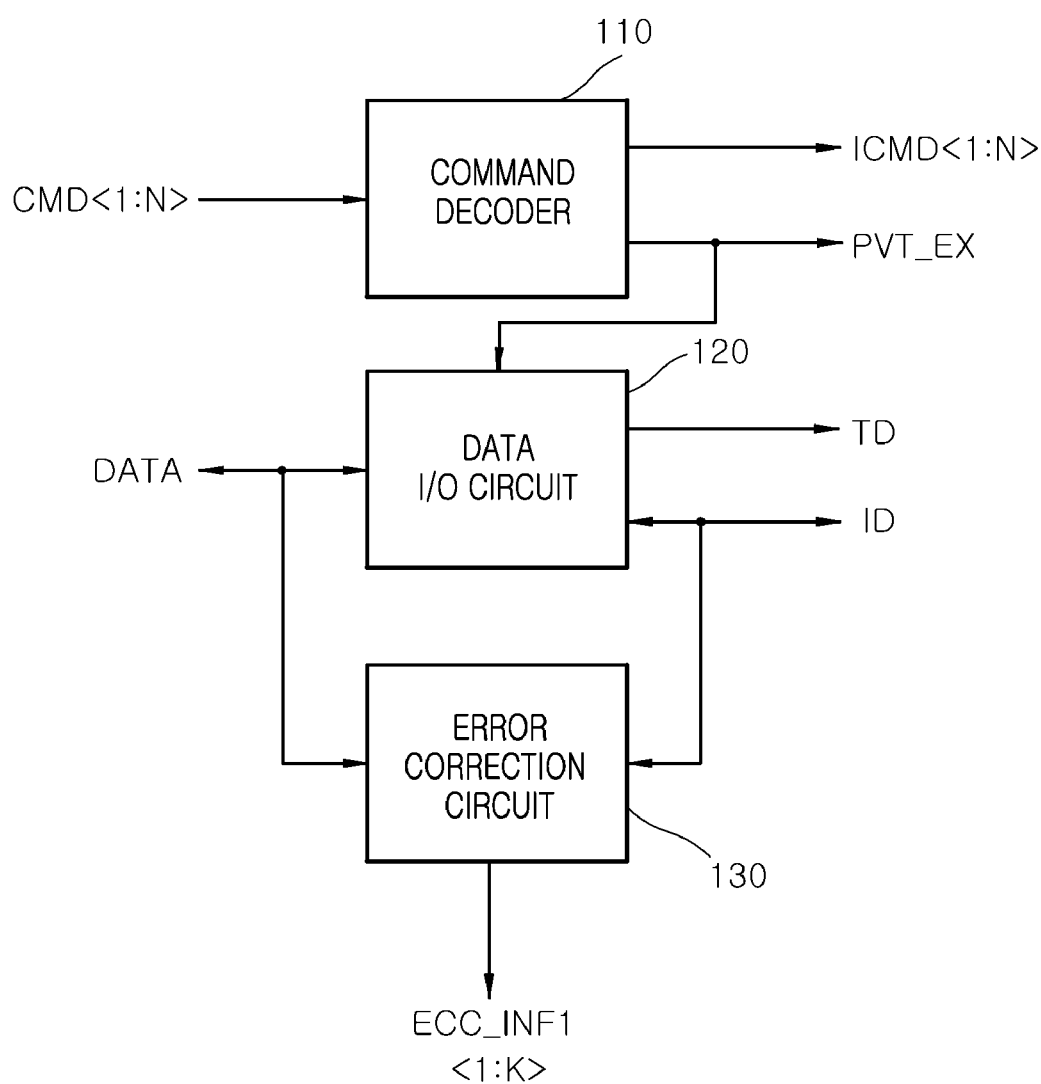
FIG. 2 is a block diagram illustrating a configuration of an example of a first rank control circuit included in the semiconductor system of FIG. 1.

Referring to FIG. 2, the first rank control circuit 100 may include a command decoder 110, a data input/output (I/O) circuit 120 and an error correction circuit 130.

The command decoder 110 may decode the command CMD<1:N> to generate an internal command ICMD<1:N> and the first extraction control signal PVT_EX. The command decoder 110 may decode the command CMD<1:N> to generate the internal command ICMD<1:N> in the normal mode. The command decoder 110 may decode the command CMD<1:N> to generate the first extraction control signal PVT_EX in the test mode.

The data I/O circuit 120 may output the data DATA as the first test data TD or first internal data ID in response to the first extraction control signal PVT_EX. The data I/O circuit 120 may buffer the data DATA to output the buffered data as the first test data TD, if the first extraction control signal PVT_EX is enabled. The data I/O circuit 120 may buffer the data DATA to output the buffered data as the first internal data ID, if the first extraction control signal PVT_EX is disabled. The data I/O circuit 120 may buffer the first internal data ID to output the buffered first internal data as the data DATA, if the first extraction control signal PVT_EX is disabled.

The error correction circuit 130 may generate the first error code ECC_INF1<1:K> including error occurrence information on the data DATA or the first internal data ID. The error correction circuit 130 may generate the first error code ECC_INF1<1:K> that is counted if an error of the data DATA or an error of the first internal data ID is created. The error correction circuit 130 may correct an error of the data DATA or an error of the first internal data ID. The first error code ECC_INF1<1:K> may be a signal including information on the number of times that errors are created.

The error correction circuit 130 may be realized with a general error correction circuit that corrects errors of the data DATA and the first internal data ID using an error detection code (EDC) which is capable of detecting errors and an error correction code (ECC) which is capable of correcting the errors by itself.

Figure 3:
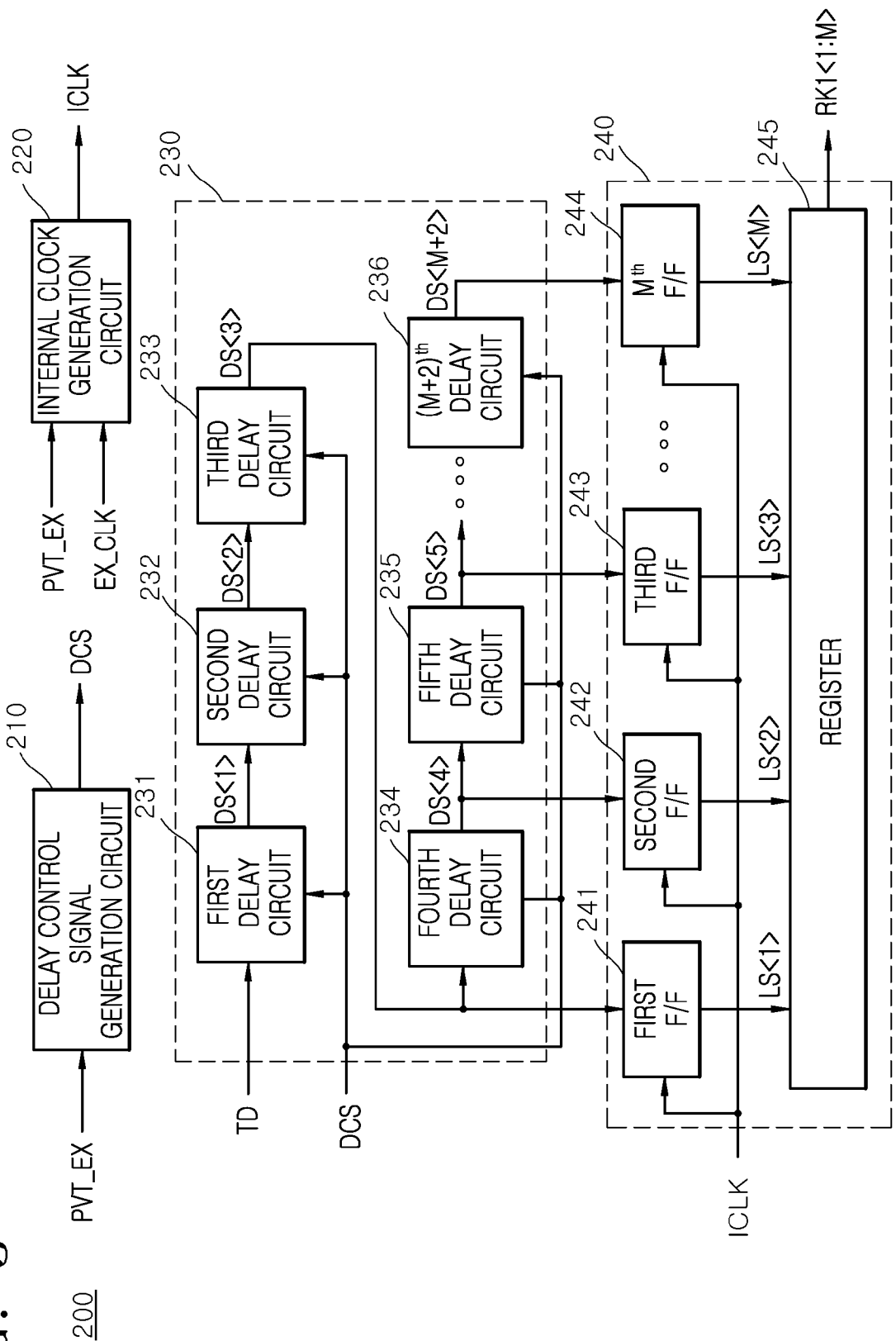
FIG. 3 is a block diagram illustrating a configuration of an example of a first code extraction circuit included in the semiconductor system of FIG. 1.

Referring to FIG. 3, the first code extraction circuit 200 may include a delay control signal generation circuit 210, an internal clock generation circuit 220, a delay signal generation circuit 230 and a delay signal storage circuit 240.

The delay control signal generation circuit 210 may generate a delay control signal DCS for adjusting a delay time in response to the first extraction control signal PVT_EX. The delay control signal generation circuit 210 may generate the delay control signal DCS for adjusting a delay time of first to $(M+2)^{th}$ delay circuits 231~236 included in the delay signal generation circuit 230, if the first extraction control signal PVT_EX is enabled. Although FIG.

3 illustrates the delay control signal DCS with a single signal line, the delay control signal DCS may be configured to include a plurality of bits. Thus, the delay time of the first to $(M+2)^{th}$ delay circuits 231~236 may be set to be different according to various logic level combinations of the bits included in the delay control signal DCS.

The internal clock generation circuit 220 may output an external clock signal EX_CLK as an internal clock signal ICLK in response to the first extraction control signal PVT_EX. The internal clock generation circuit 220 may output the external clock signal EX_CLK as the internal clock signal ICLK if the first extraction control signal PVT_EX is enabled. The external clock signal EX_CLK may be a signal that is periodically toggled to control an operation of the first semiconductor device 1. The external clock signal EX_CLK may be provided to synchronize an operation of the semiconductor device 1 with an operation of an external device.

The delay signal generation circuit 230 may include the first to $(M+2)^{th}$ delay circuits 231~236. The delay signal generation circuit 230 may delay the first test data TD by a delay time, which is set according to the delay control signal DCS, to generate first to $(M+2)^{th}$ delayed signals DS<1:(M+2)>. The first delay circuit 231 may delay the first test data TD by a delay time, which is set according to the delay control signal DCS, to generate the first delayed signal DS<1>. The second delay circuit 232 may delay the first delayed signal DS<1> by a delay time, which is set according to the delay control signal DCS, to generate the second delayed signal DS<2>. Each of the third to $(M+2)^{th}$ delay circuits 233~236 may be configured to perform the same operation as the first delay circuit 231 (or the second delay circuit 232). Accordingly, descriptions of the third to $(M+2)^{th}$ delay circuits 233~236 will be omitted hereinafter.

The delay signal storage circuit 240 may include first to $M^{th}$ flip-flops (F/Fs) 241~244 and a register 245. The delay signal storage circuit 240 may be synchronized with the internal clock signal ICLK to generate the first rank code RK1<1:M> from the third to $(M+2)^{th}$ delayed signals DS<3:(M+2)>. The delay signal storage circuit 240 may latch the third to $(M+2)^{th}$ delayed signals DS<3:(M+2)> in synchronization with the internal clock signal ICLK and may generate the first rank code RK1<1:M> from the latched third to $(M+2)^{th}$ delayed signals. The first F/F 241 may latch the third delayed signal DS<3> in synchronization with the internal clock signal ICLK and may output the latched third delayed signal as a first latch signal LS<1>. The second F/F 242 may latch the fourth delayed signal DS<4> in synchronization with the internal clock signal ICLK and may output the latched fourth delayed signal as a second latch signal LS<2>. Each of the third to $M^{th}$ F/Fs 243~244 may be configured to perform the same operation as the first F/F 241 (or the second F/F 242). Accordingly, descriptions of the third to $M^{th}$ F/Fs 243~244 will be omitted hereinafter. The register 245 may store the first to $M^{th}$ latch signals LS<1:M> therein and may output the stored first to $M^{th}$ latch signals LS<1:M> as the first rank code RK1<1:M>.

A method of generating the first rank code RK1<1:M> including information on the PVT condition of the first rank 10 will be described hereinafter.

First, in the test mode, the first extraction control signal PVT_EX may be enabled and the first test data TD may be generated to have a logic "high" level. Further, the logic levels of the signals may be different from or the opposite of those described. For example, a signal described as having a logic "high" level may alternatively have a logic "low" level, and a signal described as having a logic "low" level may alternatively have a logic "high" level.

The delay control signal generation circuit 210 may generate the delay control signal DCS for adjusting the delay time of the first to $(M+2)^{th}$ delay circuits 231~236 in response to the first extraction control signal PVT_EX.

The internal clock generation circuit 220 may output the external clock signal EX_CLK as the internal clock signal ICLK in response to the first extraction control signal PVT_EX.

The delay signal generation circuit 230 may delay the first test data TD by a delay time, which is set according to the delay control signal DCS, to generate the first to $(M+2)^{th}$ delayed signals DS<1:(M+2)>.

The first to $(M+2)^{th}$ delayed signals DS<1:(M+2)> may be generated to sequentially have a logic "high" level, and the number of signals having a logic "high" level among the first to $(M+2)^{th}$ delayed signals DS<1:(M+2)> may increase if an operation speed of the first rank 10 becomes faster due to variation of the PVT condition. For example, an operation speed of the first rank 10 when the first to eighth delayed signals DS<1:8> have a logic "high" level may be faster than an operation speed of the first rank 10 when the first to seventh delayed signals DS<1:7> have a logic "high" level. That an operation speed of the first rank 10 becomes faster due to variation of the PVT condition may mean that threshold voltages of MOS transistors included in the first rank 10 become lowered. Further, the logic levels of the signals may be different from or the opposite of those described. For example, a signal described as having a logic "high" level may alternatively have a logic "low" level, and a signal described as having a logic "low" level may alternatively have a logic "high" level.

The delay signal storage circuit 240 may latch the third to $(M+2)^{th}$ delayed signals DS<3:(M+2)> in synchronization with the internal clock signal ICLK and may output the latched signals as the first rank code RK1<1:M>.

The first rank code RK1<1:M> may include information on the PVT condition of the first rank 10.

Figure 4:
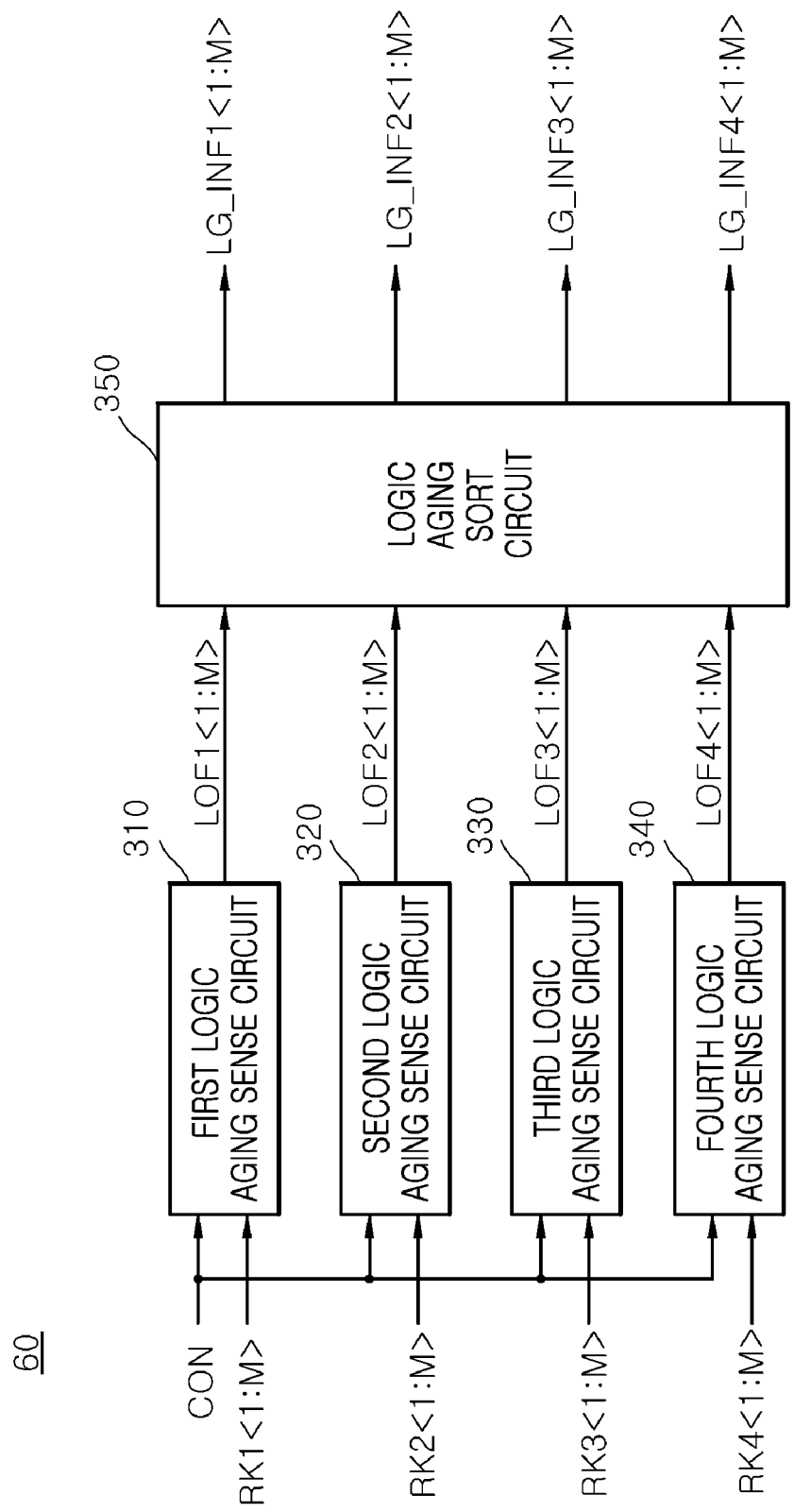
FIG. 4 is a block diagram illustrating a configuration of an example of a logic information code generation circuit included in the semiconductor system of FIG. 1.

Referring to FIG. 4, the logic information code generation circuit 60 may include a first logic aging sense circuit 310, a second logic aging sense circuit 320, a third logic aging sense circuit 330, a fourth logic aging sense circuit 340 and a logic aging sort circuit 350.

The first logic aging sense circuit 310 may synthesize the first rank code RK1<1:M> and aging information on the first rank code RK1<1:M> to generate a first logic aging code LOF1<1:M>, in response to the control signal CON. The first logic aging sense circuit 310 may synthesize the first rank code RK1<1:M> and a code generated from the first rank code RK1<1:M> after a set time to generate the first logic aging code LOF1<1:M>, in response to the control signal CON. The aging information on the first rank code RK1<1:M> may mean a variation amount of a logic level combination of the first rank code RK1<1:M> after a set time elapses from a point of time that the first rank code RK1<1:M> is stored.

The second logic aging sense circuit 320 may synthesize the second rank code RK2<1:M> and aging information on the second rank code RK2<1:M> to generate a second logic aging code LOF2<1:M>, in response to the control signal CON. The second is logic aging sense circuit 320 may synthesize the second rank code RK2<1:M> and a code generated from the second rank code RK2<1:M> after a set time to generate the second logic aging code LOF2<1:M>, in response to the control signal CON. The aging information on the second rank code RK2<1:M> may mean a variation amount of a logic level combination of the second rank code RK2<1:M> after a set time elapses from a point of time that the second rank code RK2<1:M> is stored.

The third logic aging sense circuit 330 may synthesize the third rank code RK3<1:M> and aging information on the third rank code RK3<1:M> to generate a third logic aging code LOF3<1:M>, in response to the control signal CON. The third logic aging sense circuit 330 may synthesize the third rank code RK3<1:M> and a code generated from the third rank code RK3<1:M> after a set time to generate the third logic aging code LOF3<1:M>, in response to the control signal CON. The aging information on the third rank code RK3<1:M> may mean a variation amount of a logic level combination of the third rank code RK3<1:M> after a set time elapses from a point of time that the third rank code RK3<1:M> is stored.

The fourth logic aging sense circuit 340 may synthesize the fourth rank code RK4<1:M> and aging information on the fourth rank code RK4<1:M> to generate a fourth logic aging code LOF4<1:M>, in response to the control signal CON. The fourth logic aging sense circuit 340 may synthesize the fourth rank code RK4<1:M> and a code generated from the fourth rank code RK4<1:M> after a set time to generate the fourth logic aging code LOF4<1:M>, in response to the control signal CON. The aging information on the fourth rank code RK4<1:M> may mean a variation amount of a logic level combination of the fourth rank code RK4<1:M> after a set time elapses from a point of time that the fourth rank code RK4<1:M> is stored.

The logic aging sort circuit 350 may store the first logic aging code LOF1<1:M> and may output the stored first logic aging code as the first logic information code LG_INF1<1:M>. The logic aging sort circuit 350 may store the second logic aging code LOF2<1:M> and may output the stored second logic aging code as the second logic information code LG_INF2<1:M>. The logic aging sort circuit 350 may store the third logic aging code LOF3<1:M> and may output the stored third logic aging code as the third logic information code LG_INF3<1:M>. The logic aging sort circuit 350 may store the fourth logic aging code LOF4<1:M> and may output the stored fourth logic aging code as the fourth logic information code LG_INF4<1:M>.

Figure 5:
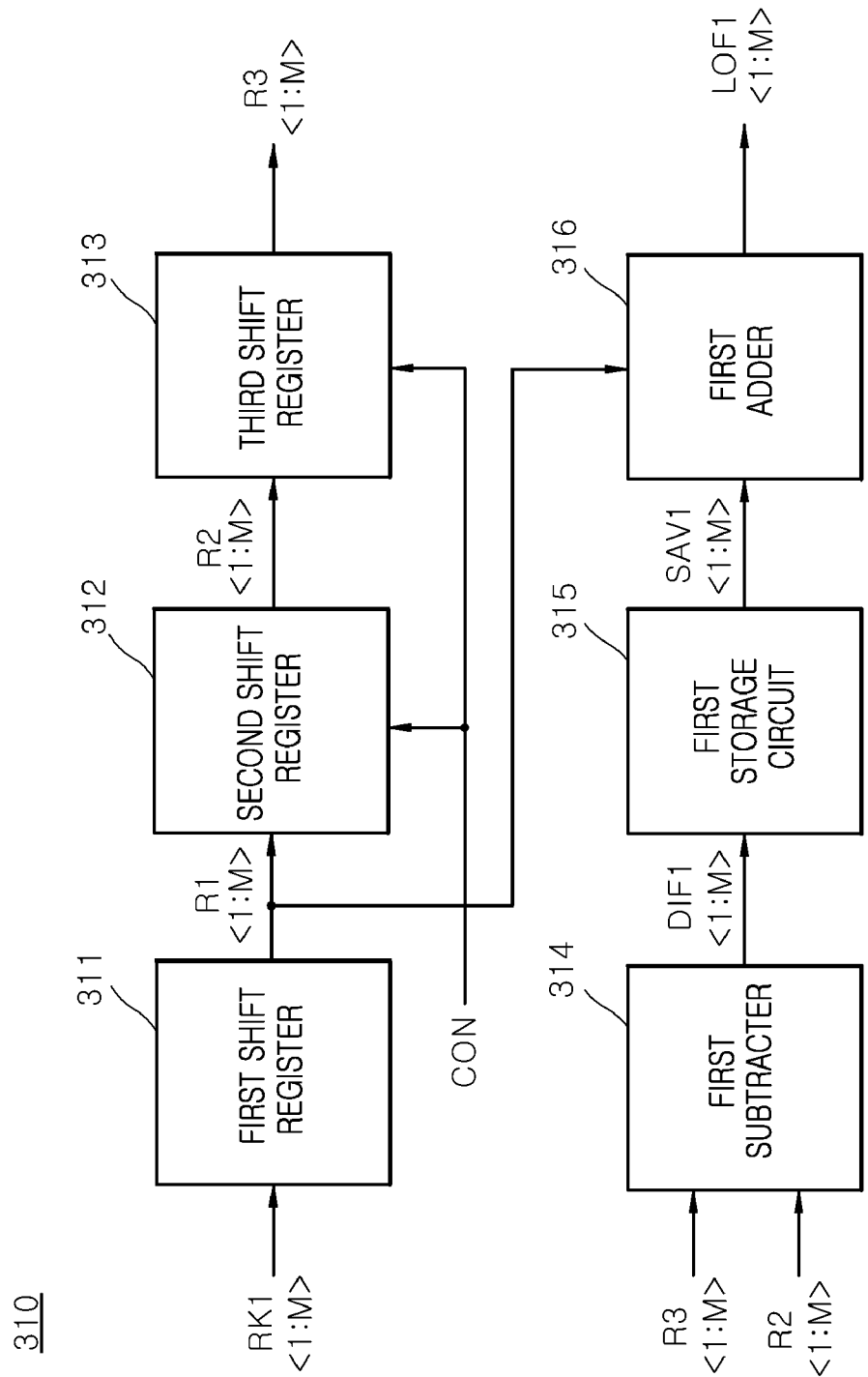
FIG. 5 is a block diagram illustrating a configuration of an example of a first logic aging sense circuit included in the logic information code generation circuit of FIG. 4.

Referring to FIG. 5, the first logic aging sense circuit 310 may include a first shift register 311, a second shift register 312, a third shift register 313, a first subtracter 314, a first storage circuit 315 and a first adder 316.

The first shift register 311 may store the first rank code RK1<1:M> and may output the stored first rank code as a first rank shift code R1<1:M>.

The second shift register 312 may store the first rank shift code R1<1:M> in response to the control signal CON and may output the stored first rank shift code as a second rank shift code R2<1:M> after a set time. A variation amount of a logic level combination of the first rank shift code R1<1:M> during the set time may be set as an aging amount. The set time means a period from a point of time that the first rank shift code R1<1:M> is generated till a point of time that the control signal CON is enabled. The set time may be set to be different according to the embodiments because the first rank shift code R1<1:M> is enabled at different points of time according to the embodiments.

The third shift register 313 may store the second rank shift code R2<1:M> in response to the control signal CON and may output the stored second rank shift code as a third rank shift code R3<1:M> after the set time. A variation amount of a logic level combination of the second rank shift code R2<1:M> during the set time may be set as an aging amount.

The first subtracter 314 may perform a subtracting operation of the second and third rank shift codes R2<1:M> and R3<1:M> to generate a first difference code DIF1<1:M>. The first subtracter 314 may subtract the second rank shift code R2<1:M> from the third rank shift code R3<1:M> to generate the first difference code DIF1<1:M>. The first difference code DIF1<1:M> may correspond to a signal including aging information on the PVT condition of the first rank 10.

The first storage circuit 315 may store the first difference code DIF1<1:M> and may output the stored first difference code as a first save code SAV1<1:M>. In some embodiments, the first storage circuit 315 may store the first difference codes DIF1<1:M> which are repeatedly generated while the first semiconductor device 1 operates. In such a case, the first storage circuit 315 may output an average value of the stored first difference codes as the first save code SAV1<1:M>.

The first adder 316 may perform an adding operation of the first rank shift code R1<1:M> and the first save code SAV1<1:M> to generate the first logic aging code LOF1<1:M>. The first adder 316 may add the first save code SAV1<1:M> to the first rank shift code R1<1:M> to generate the first logic aging code LOF1<1:M>.

Each of the second to fourth logic aging sense circuits 320, 330 and 340 illustrated in FIG. 4 may be configured to perform the same operation as the first logic aging sense circuit 310. Thus, descriptions of the second to fourth logic aging sense circuits 320, 330 and 340 will be omitted hereinafter.

Figure 6:
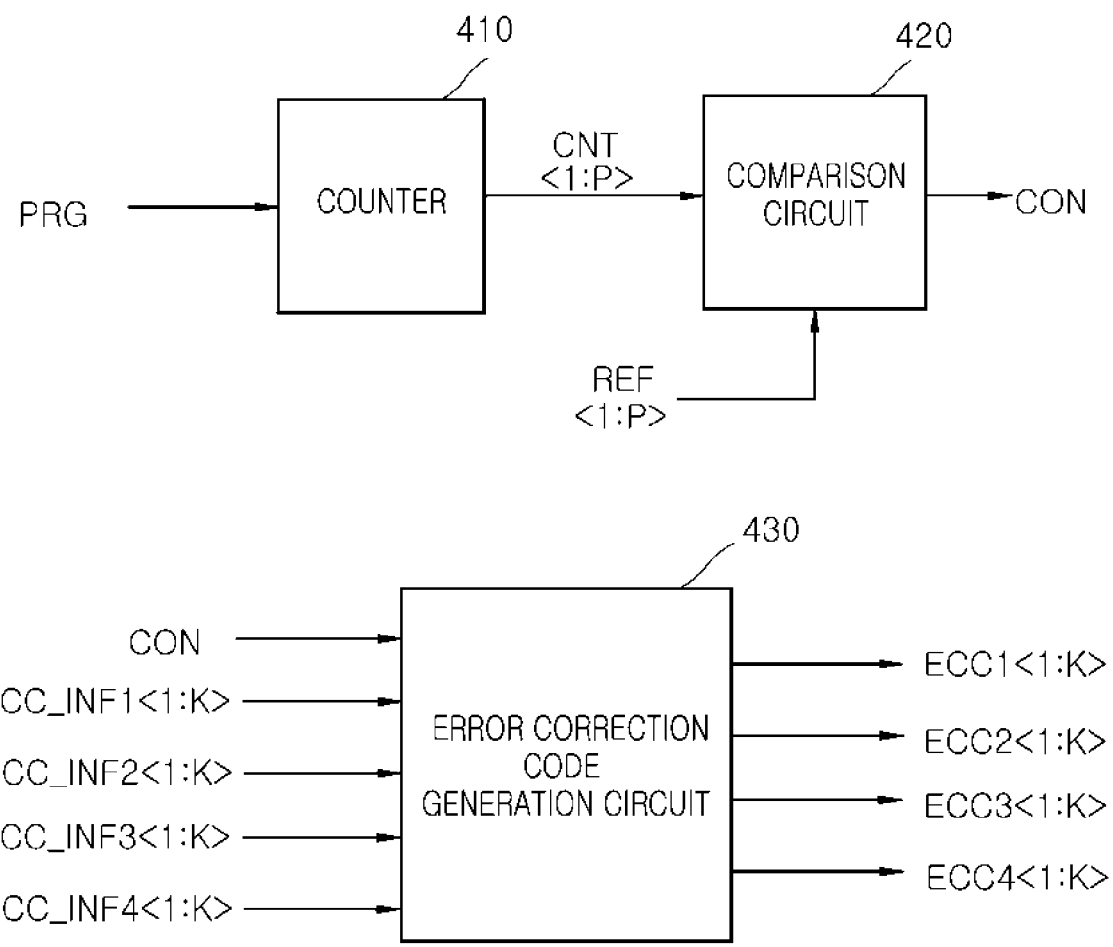
FIG. 6 is a block diagram illustrating a configuration of an example of an error information generation circuit included in the semiconductor system of FIG. 1.

Referring to FIG. 6, the error information generation circuit 70 may include a counter 410, a comparison circuit 420 and an error correction code generation circuit 430.

The counter 410 may generate a count signal CNT<1:P> that is counted in response to the program signal PRG. The counter 410 may generate the count signal CNT<1:P> that is counted up if the program signal PRG is inputted to the counter 410. The counter 410 may be realized using a general counter.

The comparison circuit 420 may compare the count signal CNT<1:P> with a reference signal REF<1:P> to generate the control signal CON. The comparison circuit 420 may generate the control signal CON which is enabled if the count signal CNT<1:P> has the same logic level combination as the reference signal REF<1:P>. The reference signal REF<1:P> may be a signal for setting the set time for sensing the aging information which is described above. The reference signal REF<1:P> may be set to have a logic level combination which is capable of sensing the number of times that the program signal PRG is inputted to the counter 410.

The error correction code generation circuit 430 may generate the first error correction code ECC1<1:K>, the second error correction code ECC2<1:K>, the third error correction code ECC3<1:K> and the fourth error correction code ECC4<1:K> from the first error code ECC_INF1<1:K>, the second error code ECC_INF2<1:K>, the third error code ECC_INF3<1:K> and the fourth error code ECC_INF4<1:K>, in response to the control signal CON. The error correction code generation circuit 430 may output the first error code ECC_INF1<1:K> as the first error correction code ECC1<1:K> if the control signal CON is enabled. The error correction code generation circuit 430 may output the second error code ECC_INF2<1:K> as the second error correction code ECC2<1:K> if the control signal CON is enabled. The error correction code generation circuit 430 may output the third error code ECC_INF3<1:

K> as the third error correction code ECC3<1:K> if the control signal CON is enabled. The error correction code generation circuit 430 may output the fourth error code ECC_INF4<1:K> as the fourth error correction code ECC4<1:K> if the control signal CON is enabled. The first error correction code ECC1<1:K> may be set to include information on the number of times that errors of the first rank 10 occur during a set time. The second error correction code ECC2<1:K> may be set to include information on the number of times that errors of the second rank 20 occur during the set time. The third error correction code ECC3<1:K> may be set to include information on the number of times that errors of the third rank 30 occur during the set time. The fourth error correction code ECC4<1:K> may be set to include information on the number of times that errors of the fourth rank 40 occur during the set time.

Figure 7:
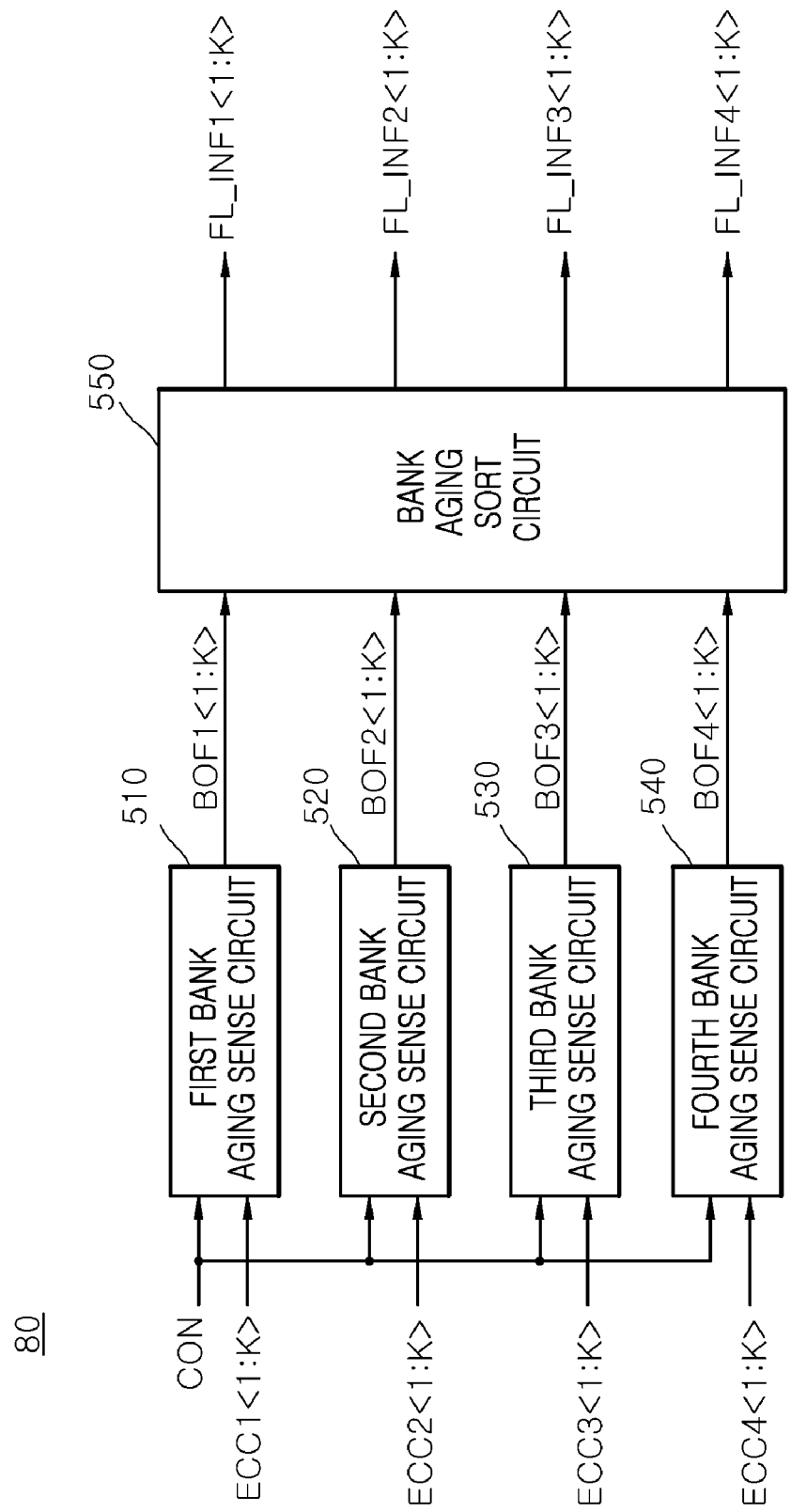
FIG. 7 is a block diagram illustrating a configuration of an example of a failure information code generation circuit included in the semiconductor system of FIG. 1.

Referring to FIG. 7, the failure information code generation circuit 80 may include a first bank aging sense circuit 510, a second bank aging sense circuit 520, a third bank aging sense circuit 530, a fourth bank aging sense circuit 540 and a bank aging sort circuit 550.

The first bank aging sense circuit 510 may synthesize the first error correction code ECC1<1:K> and aging information on the first error correction code ECC1<1:K> to generate a first bank aging code BOF1<1:K>, in response to the control signal CON. The first bank aging sense circuit 510 may synthesize the first error correction code ECC1<1:K> and a code generated from the first error correction code ECC1<1:K> after a set time to generate the first bank aging code BOF1<1:K>, in response to the control signal CON. The aging information on the first error correction code ECC1<1:K> may mean a variation amount of a logic level combination of the first error correction code ECC1<1:K> after the set time elapses from a point of time that the first error correction code ECC1<1:K> is stored. In an embodiment, for example, first error correction code ECC1<1:K> may be stored in the first bank aging sense circuit 510 to obtain the aging information relating to a variation amount of a logic level combination of the first error correction code ECC1<1:K> after the set time elapses from a point of time that the first error correction code ECC1<1:K> is stored.

The second bank aging sense circuit 520 may synthesize the second error correction code ECC2<1:K> and aging information on the second error correction code ECC2<1:K> to generate a second bank aging code BOF2<1:K>, in response to the control signal CON. The second bank aging sense circuit 520 may synthesize the second error correction code ECC2<1:K> and a code generated from the second error correction code ECC2<1:K> after a set time to generate the second bank aging code BOF2<1:K>, in response to the control signal CON. The aging information on the second error correction code ECC2<1:K> may mean a variation amount of a logic level combination of the second error correction code ECC2<1:K> after the set time elapses from a point of time that the second error correction code ECC2<1:K> is stored. In an embodiment, for example, second error correction code ECC2<1:K> may be stored in the second bank aging sense circuit 520 to obtain the aging information relating to a variation amount of a logic level combination of the second error correction code ECC2<1:K> after the set time elapses from a point of time that the second error correction code ECC2<1:K> is stored.

The third bank aging sense circuit 530 may synthesize the third error correction code ECC3<1:K> and aging information on the third error correction code ECC3<1:K> to generate a third bank aging code BOF3<1:K>, in response to the control signal CON. The third bank aging sense circuit 530 may synthesize the third error correction code ECC3<1:K> and a code generated from the third error correction code ECC3<1:K> after a set time to generate the third bank aging code BOF3<1:K>, in response to the control signal CON. The aging information on the third error correction code ECC3<1:K> may mean a variation amount of a logic level combination of the third error correction code ECC3<1:K> after the set time elapses from a point of time that the third error correction code ECC3<1:K> is stored. In an embodiment, for example, third error correction code ECC3<1:K> may be stored in the third bank aging sense circuit 530 to obtain the aging information relating to a variation amount of a logic level combination of the third error correction code ECC3<1:K> after the set time elapses from a point of time that the third error correction code ECC3<1:K> is stored.

The fourth bank aging sense circuit 540 may synthesize the fourth error correction code ECC4<1:K> and aging information on the fourth error correction code ECC4<1:K> to generate a fourth bank aging code BOF4<1:K>, in response to the control signal CON. The fourth bank aging sense circuit 540 may synthesize the fourth error correction code ECC4<1:K> and a code generated from the fourth error correction code ECC4<1:K> after a set time to generate the fourth bank aging code BOF4<1:K>, in response to the control signal CON. The aging information on the fourth error correction code ECC4<1:K> may mean a variation amount of a logic level combination of the fourth error correction code ECC4<1:K> after the set time elapses from a point of time that the fourth error correction code ECC4<1:K> is stored. In an embodiment, for example, fourth error correction code ECC4<1:K> may be stored in the fourth bank aging sense circuit 540 to obtain the aging information relating to a variation amount of a logic level combination of the fourth error correction code ECC4<1:K> after the set time elapses from a point of time that the fourth error correction code ECC4<1:K> is stored.

The bank aging sort circuit 550 may store the first bank aging code BOF1<1:K> and may output the stored first bank aging code as the first failure information code FL_INF1<1:K>. The bank aging sort circuit 550 may store the second bank aging code BOF2<1:K> and may output the stored second bank aging code as the second failure information code FL_INF2<1:K>. The bank aging sort circuit 550 may store the third bank aging code BOF3<1:K> and may output the stored third bank aging code as the third failure information code FL_INF3<1:K>. The bank aging sort circuit 550 may store the fourth bank aging code BOF4<1:K> and may output the stored fourth bank aging code as the fourth failure information code FL_INF4<1:K>.

Figure 8:
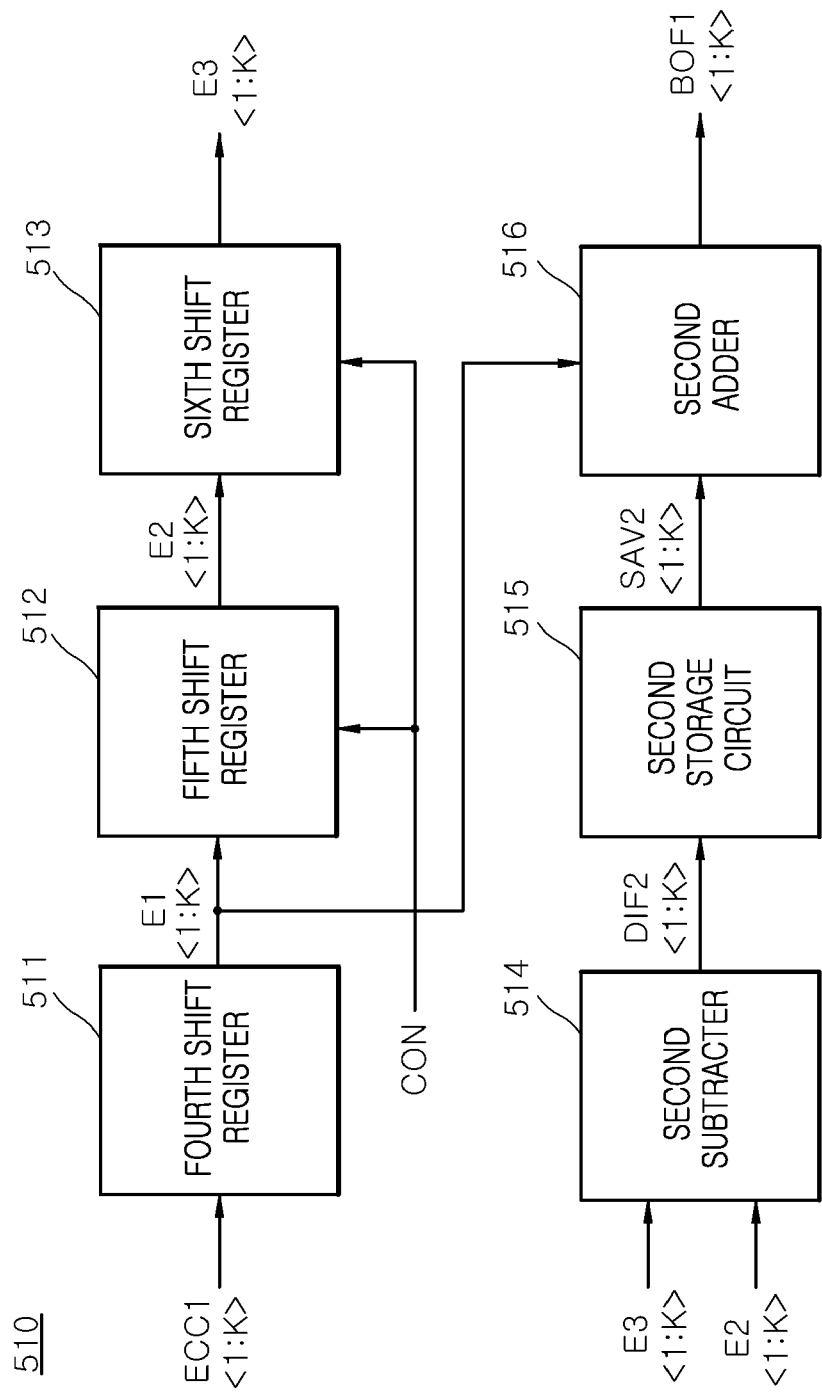
FIG. 8 is a block diagram illustrating a configuration of an example of a first bank aging sense circuit included in the failure information code generation circuit of FIG. 7.

Referring to FIG. 8, the first bank aging sense circuit 510 may include a fourth shift register 511, a fifth shift register 512, a sixth shift register 513, a second subtracter 514, a second storage circuit 515 and a second adder 516.

The fourth shift register 511 may store the first error correction code ECC1<1:K> and may output the stored first error correction code as a first error shift code E1<1:K>.

The fifth shift register 512 may store the first error shift code E1<1:K> in response to the control signal CON and may output the stored first error shift code as a second error shift code E2<1:K> after a set time. A variation amount of a logic level combination of the first error shift code E1<1:K> during the set time may be set as an aging amount.

The sixth shift register 513 may store the second error shift code E2<1:K> in response to the control signal CON and may output the stored second error shift code as a third error shift code E3<1:K> after the set time. A variation amount of a logic level combination of the second error shift code E2<1:K> during the set time may be set as an aging amount.

The second subtracter 514 may perform a subtracting operation of the second and third error shift codes E2<1:K> and E3<1:K> to generate a second difference code DIF2<1:K>. The second subtracter 514 may subtract the second error shift code E2<1:K> from the third error shift code E3<1:K> to generate the second difference code DIF2<1:K>. The second difference code DIF2<1:K> may correspond to a signal including aging information on the error occurrence amount of the first rank 10.

The second storage circuit 515 may store the second difference code DIF2<1:K> and may output the stored second difference code as a second save code SAV2<1:K>. In some embodiments, the second storage circuit 515 may store the second difference codes DIF2<1:K> which are repeatedly generated while the first semiconductor device 1 operates. The second storage circuit 515 may output an average value of the stored second difference codes as the second save code SAV2<1:K>.

The second adder 516 may perform an adding operation of the first error shift code E1<1:K> and the second save code SAV2<1:K> to generate the first bank aging code BOF1<1:K>. The second adder 516 may add the second save code SAV2<1:K> to the first error shift code E1<1:K> to generate the first bank aging code BOF1<1:M>.

Each of the second to fourth bank aging sense circuits 520, 530 and 540 illustrated in FIG. 7 may be configured to perform the same operation as the first bank aging sense circuit 510. Thus, descriptions of the second to fourth bank aging sense circuits 520, 530 and 540 will be omitted hereinafter.

Figure 9:
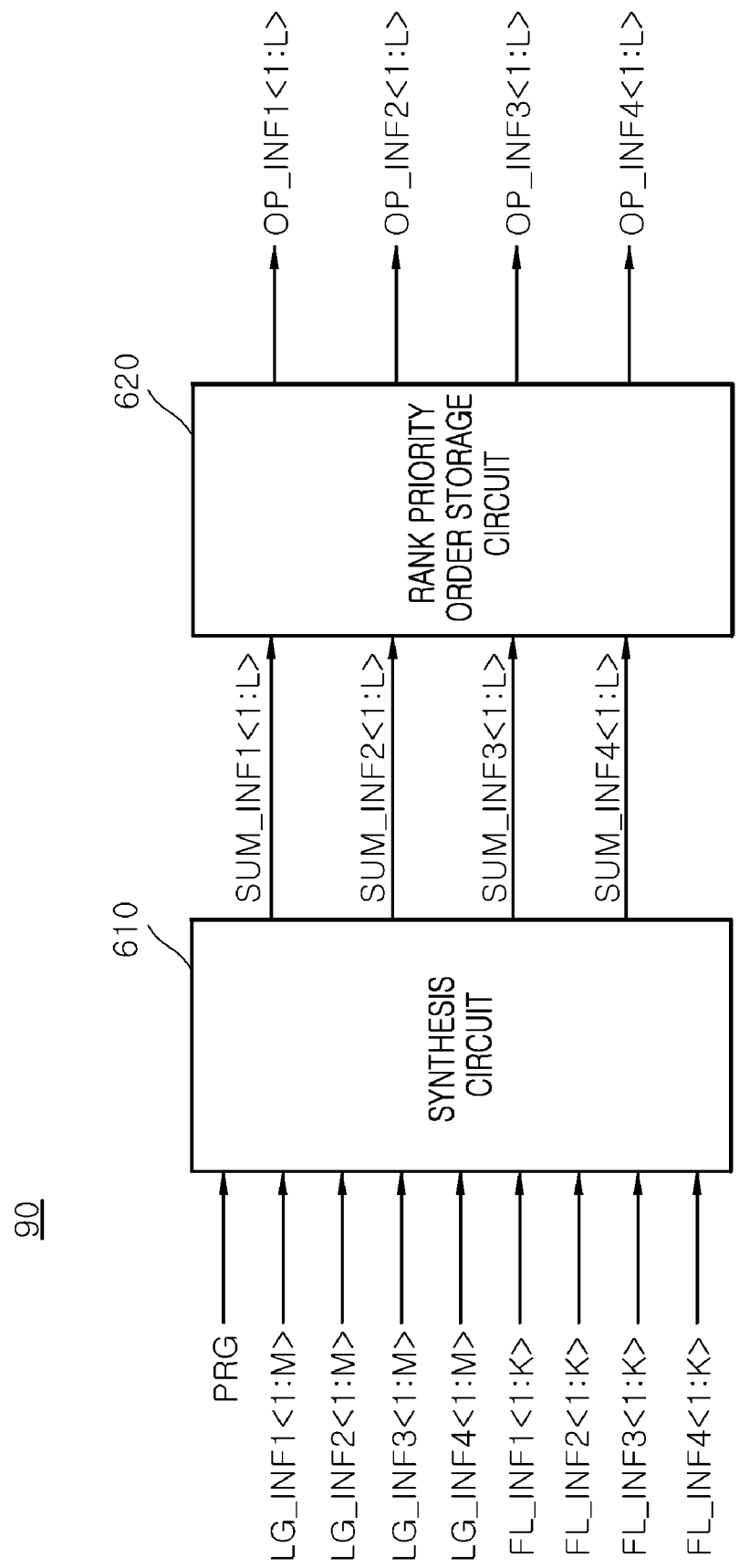
FIG. 9 is a block diagram illustrating a configuration of an example of a priority order arrangement circuit included in the semiconductor system of FIG. 1.

Referring to FIG. 9, the priority order arrangement circuit 90 may include a synthesis circuit 610 and a rank priority order storage circuit 620.

The synthesis circuit 610 may synthesize the first logic information code LG_INF1<1:M> and the first failure information code FL_INF1<1:K> to generate a first synthesized code SUM_INF1<1:L>, in response to the program signal PRG. The synthesis circuit 610 may synthesize the second logic information code LG_INF2<1:M> and the second failure information code FL_INF2<1:K> to generate a second synthesized code SUM_INF2<1:L>, in response to the program signal PRG. The synthesis circuit 610 may synthesize the third logic information code LG_INF3<1:M> and the third failure information code FL_INF3<1:K> to generate a third synthesized code SUM_INF3<1:L>, in response to the program signal PRG. The synthesis circuit 610 may synthesize the fourth logic information code LG_INF4<1:M> and the fourth failure information code FL_INF4<1:K> to generate a fourth synthesized code SUM_INF4<1:L>, in response to the program signal PRG.

The rank priority order storage circuit 620 may compare logic level combinations of the first to fourth synthesized codes SUM_INF1<1:L>, SUM_INF2<1:L>, SUM_INF3<1:L> and SUM_INF4<1:L> with each other. The rank priority order storage circuit 620 may output one having a first lowest absolute value among the first to fourth synthesized codes SUM_INF1<1:L>~SUM_INF4<1:L> as the first operation information code OP_INF1<1:L>. The rank priority order storage circuit 620 may output one having a second lowest absolute value among the first to fourth synthesized codes SUM_INF1<1:L>~SUM_INF4<1:L> as the second operation information code OP_INF2<1:L>. The rank priority order storage circuit 620 may output one having a third lowest absolute value among the first to fourth synthesized codes SUM_INF1<1:>~SUM_INF4<1:L> as the third operation information code OP_INF3<1:L>. The rank priority order storage circuit 620 may output one having a first highest absolute value among the first to fourth synthesized codes SUM_INF1<1:L>~SUM_INF4<1:L> as the fourth operation information code OP_INF4<1:L>.

The operation information code having the first lowest absolute value among the first to fourth operation information codes OP_INF1<1:L>~OP_INF4<1:L> may be an operation information code corresponding to the rank having a highest priority order. The rank having the highest priority order may include MOS transistors having a relatively high threshold voltage as one of the PVT characteristics and may have a smallest aging amount among the first to fourth ranks 10, 20, 30 and 40. In contrast, the operation information code having the first highest absolute value among the first to fourth operation information codes OP_INF1<1:L>~OP_INF4<1:L> may be an operation information code corresponding to the rank having a lowest priority order. The rank having the lowest priority order may include MOS transistors having a relatively low threshold voltage as one of the PVT characteristics and may have a largest aging amount among the first to fourth ranks 10, 20, 30 and 40.

As described above, a semiconductor system according to an embodiment may sense a PVT variation amount and an error occurrence amount and may arrange a priority order of operations of a plurality of ranks included in the semiconductor system according to the sense results. For example, in an embodiment, the rank determined to have the highest priority order according to its corresponding operation information code may be chosen by the second semiconductor device to perform an operation with, or operations with, rather than another rank having a lower priority order less than the highest priority order. In this way, in an embodiment, for example, a rank including MOS transistors having a relatively high threshold voltage as one of the PVT characteristics and having a smaller aging amount than another rank may be used over the another rank that includes MOS transistors having a relatively lower threshold voltage as one of the PVT characteristics and having a greater aging amount. In an embodiment, for example, the semiconductor device may prioritize the rank having aging information corresponding to a smaller variation amount than another rank having aging information corresponding to a greater variation amount. In an embodiment, for example, the semiconductor device may prioritize the rank having less error occurrences than another rank having more error occurrences. In an embodiment, for example, the semiconductor device may prioritize the rank having been least affected by PVT conditions over another rank being more affected by PVT conditions. However, the embodiments are not limited in this way and the semiconductor system may simply prioritize which rank to use for an operation over another rank to use for the same operation based on, for example, the PVT variation amounts and or the error occurrence amounts obtained from the ranks, respectively. In an embodiment, for example, the semiconductor system may prioritize which rank to use for an operation over using another rank for the same operation based on, for example, the PVT variation amounts and or the error occurrence amounts obtained from the ranks, respectively, to maximize the lifetime of the semiconductor system and or ranks included in the semiconductor system. In an embodiment, for example, the semiconductor system may prioritize which rank to use for an operation over using another rank for the same operation based on, for example, the PVT variation amounts and or the error occurrence amounts obtained from the ranks, respectively, to minimize the power consumption of the semiconductor system. In an embodiment, for example, the semiconductor system may prioritize which rank to use for an operation over using another rank for the same operation based on, for example, the PVT variation amounts and or the error occurrence amounts obtained from the ranks, respectively, to compensate for uncorrectable faults in a bank or banks of a corresponding rank or ranks included in the semiconductor system. In an embodiment, for example, the semiconductor system may prioritize which rank to use for an operation over using another rank for the same operation based on, for example, the PVT variation amounts and or the error occurrence amounts obtained from the ranks, respectively, to minimize the power consumption of the semiconductor system, to compensate for uncorrectable faults in a bank or banks of a corresponding rank or ranks included in the semiconductor system, to maximize the lifetime of the semiconductor system and or ranks included in the semiconductor system (i.e., maximize a number of operations the rank and or semiconductor system can perform in a lifetime), to minimize the amount of refreshes performed by the ranks, to minimize the number of errors occurring in the ranks, minimize an error rate of the semiconductor system, and to provide any combination thereof.

Figure 10:
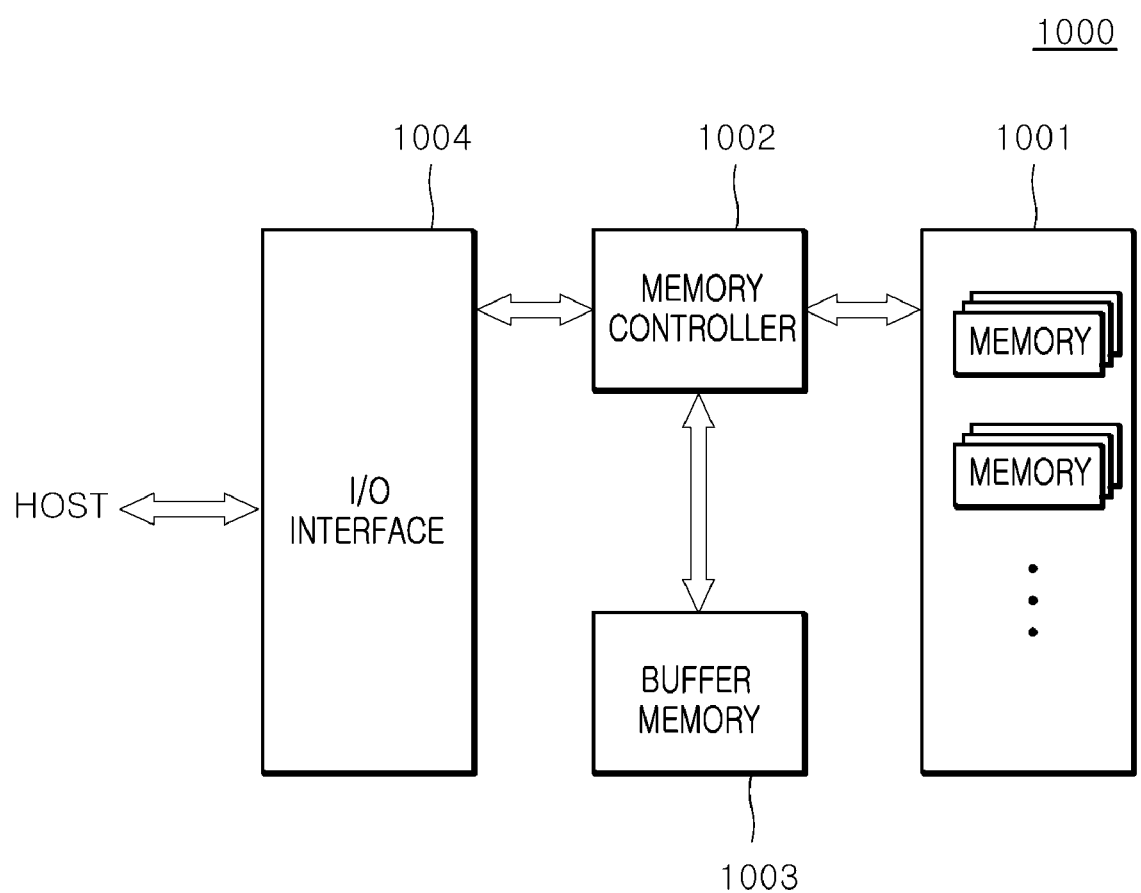
FIG. 10 is a block diagram illustrating a configuration of an electronic system employing the semiconductor system described with reference to FIGS. 1 to 9.

The semiconductor system described with reference to FIGS. 1 to 9 may be applied to an electronic system that includes a memory system, a graphic system, a computing system, a mobile system, or the like. For example, as illustrated in FIG. 10, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the first semiconductor device 1 illustrated in FIG. 1. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like. In an embodiment, for example, the data storage circuit 1001 may include a plurality of ranks, semiconductor dies, or semiconductor chips corresponding to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits to which the embodiments associated with FIG. 1 may be applied.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include the second semiconductor device 2 illustrated in FIG. 1. Although FIG. 10 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (DATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 11:
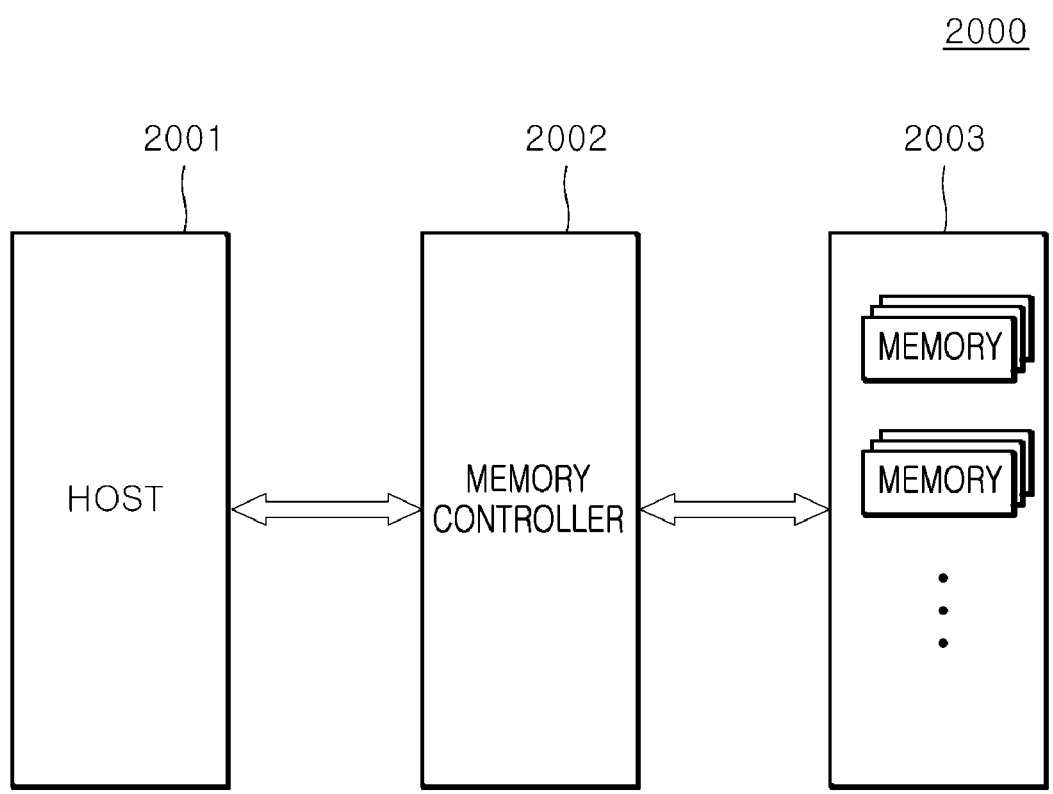
FIG. 11 is a block diagram illustrating a configuration of another electronic system employing the semiconductor system described with reference to FIGS. 1 to 9.

Referring to FIG. 11, an electronic system 2000 according an embodiment may include a host 2001, a memory controller 2002 and a data storage circuit 2003.

The host 2001 may output a request signal and data to the memory controller 2002 to access to the data storage circuit 2003. The memory controller 2002 may supply the data, a data strobe signal, a command, addresses and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects errors of the data using an error correction code (ECC) scheme.

The memory controller 2002 may act as an interface that connects the host 2001 to the data storage circuit 2003 for communication between the host 2001 and the data storage circuit 2003. The memory controller 2002 may receive the request signal and the data outputted from the host 2001 and may generate and supply the data, the data strobe signal, the command, the addresses and the clock signal to the data storage circuit 2003 in order to control operations of the data storage circuit 2003. In addition, the memory controller 2002 may supply the data outputted from the data storage circuit 2003 to the host 2001. The memory controller 2002 may include the second semiconductor device 2 illustrated in FIG. 1.

The data storage circuit 2003 may include a plurality of memories. The data storage circuit 2003 may receive the data, the data strobe signal, the command, the addresses and the clock signal from the memory controller 2002 to execute the write operation or the read operation. Each of the memories included in the data storage circuit 2003 may include a circuit that corrects the errors of the data using an error correction code (ECC) scheme. The data storage circuit 2003 may include the first semiconductor device 1 illustrated in FIG. 1.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a single chip according to the embodiments. The memory controller 2002 and the data storage circuit 2003 may be realized in a single chip according to the embodiments.

What is claimed is:

1. A semiconductor system comprising:
a first semiconductor device including a first and second rank, the first rank configured to generate a first rank code and a first error code, and the second rank configured to generate a second rank code and a second error code; and
a second semiconductor device configured to prioritize operations of the first rank and the second rank according to the first and second rank codes and the first and second error codes received from the first semiconductor device,
wherein the first rank code is generated according to a delay time of first test data,
wherein the first error code is generated to include first error occurrence information,
wherein the second rank code is generated according to a delay time of second test data, and
wherein the second error code is generated to include second error occurrence information.

2. The semiconductor system of claim 1,
wherein the first rank code includes information on process, voltage, and temperature PVT conditions of the first rank; and
wherein the second rank code includes information on PVT conditions of the second rank.

3. The semiconductor system of claim 1,
wherein the first error occurrence information corresponds to information on error occurrences in the first rank; and
wherein the second error occurrence information corresponds to information on error occurrences in the second rank.

4. The semiconductor system of claim 1,
wherein the first rank generates the first rank code and the first error code in a test mode, and
wherein the first rank includes:

a first rank control circuit configured to generate the first test data from data in response to a command, configured to generate a first extraction control signal for activating the test mode, and configured to generate the first error code;
a first code extraction circuit configured to delay the first test data in response to the first extraction control signal and configured to generate the first rank code according to a delay time of the first test data; and
a plurality of banks configured to store first internal data generated from the data and configured to output the stored first internal data.

5. The semiconductor system of claim 4, wherein the first rank control circuit includes:
a first command decoder configured to decode the command to generate a first internal command and the first extraction control signal;
a first data input and output (I/O) circuit configured to generate the first test data or the first internal data from the data based on the first extraction control signal; and
a first error correction circuit configured to detect an error in the data or the first internal data to generate the first error code.

6. The semiconductor system of claim 5, wherein the first error correction circuit detects the errors in the data and the first internal data using an error detection code and corrects errors in the data and the first internal data using an error correction code.

7. The semiconductor system of claim 4, wherein the first code extraction circuit includes:
a first delay control signal generation circuit configured to generate a first delay control signal for adjusting a delay time based on the first extraction control signal;
a first internal clock generation circuit configured to buffer an external clock signal in response to the first extraction control signal to generate a first internal clock signal;
a first delay signal generation circuit configured to delay the first test data by a delay time, which is set according to the first delay control signal, to generate a first delayed signal; and
a first delay signal storage circuit configured to be synchronized with the first internal clock signal to store the first delayed signal and to output the stored first delayed signal as the first rank code.

8. The semiconductor system of claim 7, wherein the first rank code corresponds to an operation speed of the first rank, and the operation speed is changed by PVT conditions of the first rank due to the PVT conditions changing threshold voltages of MOS transistors included in the first rank.

9. The semiconductor system of claim 1,
wherein the second rank generates the second rank code and the second error code in a test mode, and
wherein the second rank includes:
a second rank control circuit configured to generate the second test data from data in response to a command, configured to generate a second extraction control signal for activating the test mode, and configured to generate the second error code;
a second code extraction circuit configured to delay the second test data in response to the second extraction control signal and configured to generate the second rank code according to a delay time of the second test data; and
a plurality of banks configured to store second internal data generated from the data and configured to output the stored second internal data.

10. The semiconductor system of claim 9, wherein the second rank control circuit includes:
- a second command decoder configured to decode the command to generate a second internal command and the second extraction control signal;
- a second data I/O circuit configured to generate the second test data or the second internal data from the data based on the second extraction control signal; and
- a second error correction circuit configured to detect an error in the data or the second internal data to generate the second error code.

11. The semiconductor system of claim 10, wherein the second error correction circuit detects the errors in the data and the first internal data using an error detection code and corrects errors in the data and the first internal data using an error correction code.

12. The semiconductor system of claim 9, wherein the second code extraction circuit includes:
- a second delay control signal generation circuit configured to generate a second delay control signal for adjusting a delay time based on the second extraction control signal;
- a second internal clock generation circuit configured to buffer an external clock signal in response to the second extraction control signal to generate a second internal clock signal;
- a second delay signal generation circuit configured to delay the second test data by a delay time, which is set according to the second delay control signal, to generate a second delayed signal; and
- a second delay signal storage circuit configured to be synchronized with the second internal clock signal to store the second delayed signal and to output the stored second delayed signal as the second rank code.

13. The semiconductor system of claim 12, wherein the second rank code corresponds to an operation speed of the second rank, and the operation speed is changed by PVT conditions of the second rank due to the PVT conditions changing threshold voltages of MOS transistors included in the second rank.

14. The semiconductor system of claim 1,
wherein the first rank generates the first rank code and the first error code in a test mode,
wherein the second rank generates the second rank code and the second error code in the test mode, and
wherein the second semiconductor device includes:
- a memory control circuit configured to output a command for activating the test mode and data and configured to arrange prioritize operations of the first and second ranks according to a first operation information code and a second operation information code;
- a logic information code generation circuit configured to synthesize the first rank code and aging information on the first rank code to generate a first logic information code based on a control signal and configured to synthesize the second rank code and aging information on the second rank code to generate a second logic information code based on the control signal;
- an error information generation circuit configured to generate the control signal which is enabled if a program signal is inputted a predetermined number of times, configured to generate a first error correction code from the first error code, and configured to generate a second error correction code from the second error code;
- a failure information code generation circuit configured to synthesize the first error correction code and aging information on the first error correction code to generate a first failure information code based on the control signal and configured to synthesize the second error correction code and aging information on the second error correction code to generate a second failure information code based on the control signal; and
- a priority order arrangement circuit configured to synthesize the first logic information code and the first failure information code as well as to synthesize the second logic information code and the second failure information code to generate the first operation information code and the second operation information code.

15. The semiconductor system of claim 14, wherein the logic information code generation circuit includes:
- a first logic aging sense circuit configured to synthesize the first rank code and aging information on the first rank code to generate a first logic aging code, based on the control signal;
- a second logic aging sense circuit configured to synthesize the second rank code and aging information on the second rank code to generate a second logic aging code, based on the control signal; and
- a logic aging sort circuit configured to store the first logic aging code and the second logic aging code and configured to respectively output the stored first logic aging code and the stored second logic aging code as the first logic information code and the second logic information code.

16. The semiconductor system of claim 15, wherein the first logic aging sense circuit includes:
- a first shift register configured to store the first rank code and configured to output the stored first rank code as a first rank shift code;
- a second shift register configured to store the first rank shift code if the control signal is enabled and configured to output the stored first rank shift code as a second rank shift code after a set time elapses from a point of time that the control signal is enabled;
- a third shift register configured to store the second rank shift code if the control signal is enabled and configured to output the stored second rank shift code as a third rank shift code after the set time elapses from a point of time that the control signal is enabled;
- a first subtracter configured to subtract the second rank shift code from the third rank shift code to generate a first difference code;
- a first storage circuit configured to store the first difference code to output the stored first difference code as a first save code or configured to store the first difference codes, which are repeatedly generated, to output an average value of the stored first difference codes as the first save code; and
- a first adder configured to add the first save code to the first rank shift code to generate the first logic aging code.

17. The semiconductor system of claim 16,
wherein the third rank shift code is generated after the set time elapses from a point of time that the second rank shift code is generated, and
wherein the first difference code includes aging information on the first rank.

18. The semiconductor system of claim 15, wherein the second logic aging sense circuit includes:
- a fourth shift register configured to store the second rank code and configured to output the stored second rank code as a fourth rank shift code;

a fifth shift register configured to store the fourth rank shift code if the control signal is enabled and configured to output the stored fourth rank shift code as a fifth rank shift code after a set time elapses from a point of time that the control signal is enabled;

a sixth shift register configured to store the fifth rank shift code if the control signal is enabled and configured to output the stored fifth rank shift code as a sixth rank shift code after the set time elapses from a point of time that the control signal is enabled;

a second subtracter configured to subtract the fifth rank shift code from the sixth rank shift code to generate a second difference code;

a second storage circuit configured to store the second difference code to output the stored second difference code as a second save code or configured to store the second difference codes, which are repeatedly generated, to output an average value of the stored second difference codes as the second save code; and a second adder configured to add the second save code to the fourth rank shift code to generate the second logic aging code.

19. The semiconductor system of claim 18,
wherein the sixth rank shift code is generated after the set time elapses from a point of time that the fifth rank shift code is generated, and
wherein the second difference code includes aging information on the second rank.

20. The semiconductor system of claim 14, wherein the error information generation circuit includes:
a counter configured to generate a count signal that is counted based on the program signal;
a comparison circuit configured to compare the count signal with a reference signal to generate the control signal; and
an error correction code generation circuit configured to generate the first error correction code from the first error code and to generate the second error correction code from the second error code, based on the control signal.

21. The semiconductor system of claim 14, wherein the failure information code generation circuit includes:
a first bank aging sense circuit configured to synthesize the first error correction code and aging information of the first error correction code to generate a first bank aging code, based on the control signal;
a second bank aging sense circuit configured to synthesize the second error correction code and aging information of the second error correction code to generate a second bank aging code, based on the control signal; and
a bank aging sort circuit configured to store the first bank aging code and the second bank aging code and configured to respectively output the stored first bank aging code and the stored second bank aging code as the first failure information code and the second failure information code.

22. The semiconductor system of claim 21, wherein the aging information of the first error correction code is a variation amount of a logic level combination of the first error correction code after a set time elapse from a point of time that the first error correction code is stored within the first bank aging sense circuit.

23. The semiconductor system of claim 21, wherein the first bank aging sense circuit includes:
a seventh shift register configured to store the first error correction code and configured to output the stored first error correction code as a first error shift code;

an eighth shift register configured to store the first error shift code if the control signal is enabled and configured to output the stored first error shift code as a second error shift code after a set time elapses from a point of time that the control signal is enabled;

a ninth shift register configured to store the second error shift code if the control signal is enabled and configured to output the stored second error shift code as a third error shift code after the set time elapses from a point of time that the control signal is enabled;

a third subtracter configured to subtract the second error shift code from the third error shift code to generate a third difference code;

a third storage circuit configured to store the third difference code to output the stored third difference code as a third save code or configured to store the third difference codes, which are repeatedly generated, to output an average value of the stored third difference codes as the third save code; and a third adder configured to add the third save code to the first error shift code to generate the first bank aging code.

24. The semiconductor system of claim 23, wherein the third difference code corresponds to a signal including aging information on an error occurrence amount of the first rank.

25. The semiconductor system of claim 21, wherein the second bank aging sense circuit includes:
a tenth shift register configured to store the second error correction code and configured to output the stored second error correction code as a fourth error shift code;
an eleventh shift register configured to store the fourth error shift code if the control signal is enabled and configured to output the stored fourth error shift code as a fifth error shift code after a set time elapses from a point of time that the control signal is enabled;
a twelfth shift register configured to store the fifth error shift code if the control signal is enabled and configured to output the stored fifth error shift code as a sixth error shift code after the set time elapses from a point of time that the control signal is enabled;
a fourth subtracter configured to subtract the fifth error shift code from the sixth error shift code to generate a fourth difference code;
a fourth storage circuit configured to store the fourth difference code to output the stored fourth difference code as a fourth save code or configured to store the fourth difference codes, which are repeatedly generated, to output an average value of the stored fourth difference codes as the fourth save code; and
a fourth adder configured to add the fourth save code to the fourth error shift code to generate the second bank aging code.

26. The semiconductor system of claim 25, wherein the fourth difference code corresponds to a signal including aging information on an error occurrence amount of the second rank.

27. The semiconductor system of claim 14, wherein the priority order arrangement circuit includes:
a synthesis circuit configured to synthesize the first logic information code and the first failure information code to generate a first synthesized code based on the program signal and configured to synthesize the second logic information code and the second failure information code to generate a second synthesized code based on the program signal; and a rank priority order storage circuit configured to compare absolute values of logic level combinations of the first and second synthesized codes and configured to output one of the first and second synthesized codes having a relatively lower absolute value as the first operation information code and to output the other of the first and second synthesized codes having a relatively higher absolute value as the second operation information code.

28. A semiconductor system comprising:
a first rank configured to output a first rank code and a first error code;
a second rank configured to output a second rank code and a second error code; and
a semiconductor device configured to detect information on process, voltage, and temperature (PVT) conditions and error occurrence of the first rank according to the first rank code and the first error code, configured to obtain information on PVT conditions and error occurrence of the second rank according to the second rank code and the second error code, and configured to prioritize operations of the first and second ranks according to a results of detection.

29. The semiconductor system of claim 28,
wherein the first error code includes information on error occurrences in the first rank; and
wherein the second error code includes information on error occurrences in the second rank.

30. The semiconductor system of claim 28, wherein the semiconductor device includes:
a memory control circuit configured to arrange prioritize operations of the first and second ranks according to a first operation information code and a second operation information code;
a logic information code generation circuit configured to synthesize the first rank code and aging information on the first rank code to generate a first logic information code based on a control signal and configured to synthesize the second rank code and aging information on the second rank code to generate a second logic information code based on the control signal;
an error information generation circuit configured to generate the control signal which is enabled if a program signal is inputted a predetermined number of times, configured to generate a first error correction code from the first error code, and configured to generate a second error correction code from the second error code;
a failure information code generation circuit configured to synthesize the first error correction code and aging information on the first error correction code to generate a first failure information code based on the control signal and configured to synthesize the second error correction code and aging information on the second error correction code to generate a second failure information code based on the control signal; and
a priority order arrangement circuit configured to synthesize the first logic information code and the first failure information code as well as to synthesize the second logic information code and the second failure information code to generate the first operation information code and the second operation information code.

31. The semiconductor system of claim 30, wherein the logic information code generation circuit includes:

a first logic aging sense circuit configured to synthesize the first rank code and aging information on the first rank code to generate a first logic aging code, based on the control signal;
a second logic aging sense circuit configured to synthesize the second rank code and aging information on the second rank code to generate a second logic aging code, based on the control signal; and
a logic aging sort circuit configured to store the first logic aging code and the second logic aging code and configured to respectively output the stored first logic aging code and the stored second logic aging code as the first logic information code and the second logic information code.

32. The semiconductor system of claim 31, wherein the first logic aging sense circuit includes:
a first shift register configured to store the first rank code and configured to output the stored first rank code as a first rank shift code;
a second shift register configured to store the first rank shift code if the control signal is enabled and configured to output the stored first rank shift code as a second rank shift code after a set time elapses from a point of time that the control signal is enabled;
a third shift register configured to store the second rank shift code if the control signal is enabled and configured to output the stored second rank shift code as a third rank shift code after the set time elapses from a point of time that the control signal is enabled;
a first subtracter configured to subtract the second rank shift code from the third rank shift code to generate a first difference code;
a first storage circuit configured to store the first difference code to output the stored first difference code as a first save code or configured to store the first difference codes, which are repeatedly generated, to output an average value of the stored first difference codes as the first save code; and
a first adder configured to add the first save code to the first rank shift code to generate the first logic aging code.

33. The semiconductor system of claim 32,
wherein the third rank shift code is generated after the set time elapses from a point of time that the second rank shift code is generated, and
wherein the first difference code includes aging information on the first rank.

34. The semiconductor system of claim 31, wherein the second logic aging sense circuit includes:
a fourth shift register configured to store the second rank code and configured to output the stored second rank code as a fourth rank shift code;
a fifth shift register configured to store the fourth rank shift code if the control signal is enabled and configured to output the stored fourth rank shift code as a fifth rank shift code after a set time elapses from a point of time that the control signal is enabled;
a sixth shift register configured to store the fifth rank shift code if the control signal is enabled and configured to output the stored fifth rank shift code as a sixth rank shift code after the set time elapses from a point of time that the control signal is enabled;
a second subtracter configured to subtract the fifth rank shift code from the sixth rank shift code to generate a second difference code;
a second storage circuit configured to store the second difference code to output the stored second difference code as a second save code or configured to store the second difference codes, which are repeatedly generated, to output an average value of the stored second difference codes as the second save code; and a second adder configured to add the second save code to the fourth rank shift code to generate the second logic aging code.

35. The semiconductor system of claim 34,
wherein the sixth rank shift code is generated after the set time elapses from a point of time that the fifth rank shift code is generated, and
wherein the second difference code includes aging information on the second rank.

36. The semiconductor system of claim 30, wherein the error information generation circuit includes:
  a counter configured to generate a count signal that is counted based on the program signal;
  a comparison circuit configured to compare the count signal with a reference signal to generate the control signal; and
  an error correction code generation circuit configured to generate the first error correction code from the first error code and to generate the second error correction code from the second error code, based on the control signal.

37. The semiconductor system of claim 30, wherein the failure information code generation circuit includes:
  a first bank aging sense circuit configured to synthesize the first error correction code and aging information of the first error correction code to generate a first bank aging code, based on the control signal;
  a second bank aging sense circuit configured to synthesize the second error correction code and aging information of the second error correction code to generate a second bank aging code, based on the control signal; and
  a bank aging sort circuit configured to store the first bank aging code and the second bank aging code and configured to respectively output the stored first bank aging code and the stored second bank aging code as the first failure information code and the second failure information code.

38. The semiconductor system of claim 37, wherein the first bank aging sense circuit includes:
  a seventh shift register configured to store the first error correction code and configured to output the stored first error correction code as a first error shift code;
  an eighth shift register configured to store the first error shift code if the control signal is enabled and configured to output the stored first error shift code as a second error shift code after a set time elapses from a point of time that the control signal is enabled;
  a ninth shift register configured to store the second error shift code if the control signal is enabled and configured to output the stored second error shift code as a third error shift code after the set time elapses from a point of time that the control signal is enabled;
  a third subtracter configured to subtract the second error shift code from the third error shift code to generate a third difference code;
  a third storage circuit configured to store the third difference code to output the stored third difference code as a third save code or configured to store the third difference codes, which are repeatedly generated, to output an average value of the stored third difference codes as the third save code; and
  a third adder configured to add the third save code to the first error shift code to generate the first bank aging code.

39. The semiconductor system of claim 37, wherein the second bank aging sense circuit includes:
  a tenth shift register configured to store the second error correction code and configured to output the stored second error correction code as a fourth error shift code;
  an eleventh shift register configured to store the fourth error shift code if the control signal is enabled and configured to output the stored fourth error shift code as a fifth error shift code after a set time elapses from a point of time that the control signal is enabled;
  a twelfth shift register configured to store the fifth error shift code if the control signal is enabled and configured to output the stored fifth error shift code as a sixth error shift code after the set time elapses from a point of time that the control signal is enabled;
  a fourth subtracter configured to subtract the fifth error shift code from the sixth error shift code to generate a fourth difference code;
  a fourth storage circuit configured to store the fourth difference code to output the stored fourth difference code as a fourth save code or configured to store the fourth difference codes, which are repeatedly generated, to output an average value of the stored fourth difference codes as the fourth save code; and
  a fourth adder configured to add the fourth save code to the fourth error shift code to generate the second bank aging code.

40. The semiconductor system of claim 30, wherein the priority order arrangement circuit includes:
  a synthesis circuit configured to synthesize the first logic information code and the first failure information code to generate a first synthesized code based on the program signal and configured to synthesize the second logic information code and the second failure information code to generate a second synthesized code based on the program signal; and
  a rank priority order storage circuit configured to compare absolute values of logic level combinations of the first and second synthesized codes and configured to output one of the first and second synthesized codes having a relatively lower absolute value as the first operation information code and to output the other of the first and second synthesized codes having a relatively higher absolute value as the second operation information code.

* * * * *